United States Patent
McCain

(10) Patent No.: US 7,827,020 B2
(45) Date of Patent: *Nov. 2, 2010

(54) POST INITIAL MICROCODE LOAD CO-SIMULATION

(75) Inventor: Edward C. McCain, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

This patent is subject to a terminal disclaimer.

(21) Appl. No.: 12/368,452

(22) Filed: Feb. 10, 2009

(65) Prior Publication Data

US 2009/0144043 A1    Jun. 4, 2009

Related U.S. Application Data

(63) Continuation of application No. 10/843,607, filed on May 11, 2004, now Pat. No. 7,519,525.

(51) Int. Cl.
*G06F 17/50* (2006.01)
*G06F 9/45* (2006.01)

(52) U.S. Cl. .............................. 703/14; 703/15; 703/22

(58) Field of Classification Search .................... 703/14, 703/15, 22
See application file for complete search history.

(56) References Cited

U.S. PATENT DOCUMENTS

| | | | |
|---|---|---|---|
| 5,678,028 A * | 10/1997 | Bershteyn et al. | ............. 703/22 |
| 5,768,567 A | 6/1998 | Klein et al. | |
| 5,987,243 A | 11/1999 | Aihara | |
| 2001/0008017 A1* | 7/2001 | Moore et al. | ................. 713/320 |
| 2003/0074177 A1 | 4/2003 | Bowen | |

FOREIGN PATENT DOCUMENTS

JP        2000357181 A    * 12/2000

OTHER PUBLICATIONS

"SimAPI—A Common programming interface for simulation", G.G. Hallock et al. IBM Journal of Research and Development. vol. 41, Nos. 4/5 Jul./Sep. 1997.
"z-CECSIM: An Efficient and Comprehensive Microcode Simulator for the IBM eServer Z900", J. von Buttlar et al., IBM J. Res. & Dev., vol. 46, No. 4/5, Jul./Sep. 2002, pp. 607-615.
Koerner et al. "IBM eServer v900 System Microcode Vertification by Simulation: The Virtual Power-on Process", IBM Journal of Research & Development, vol. 46, No. 4/5 Jul./Sep. 2002, pp. 587-595.
Yim et al. "Design Vertification of Complex Microprocessors", Proceedings of IEE Asia Pacific Conference on Circuits and Systems '96, Nov. 18-21, 1996, Seoul Korea, pp. 441-448.
Kayser et al. Hyper-Acceleration and HW/SW Co-Verification as an Essential Part of IBM eServer z900 Verification, IBM Journal of Research & Development, vol. 46, No. 4/5 Jul./Sep. 2002, pp. 597-605.
Schubert et al. "Accelerating System Integration by Enhancing Hardware, Firmware, and Co-Simulation", IBM Journal of Research & Development, vol. 48, No. 3/4 May/Jul. 2004, pp. 569-581.

* cited by examiner

*Primary Examiner*—Paul L Rodriguez
*Assistant Examiner*—Nithya Janakiraman
(74) *Attorney, Agent, or Firm*—Cantor Colburn LLP; John Campbell

(57) ABSTRACT

Disclosed is simulation of circuit behavior by running a central electronic core simulation in a high level simulator up to and including initial microload, creation of a post-IML (initial microcode load) state, and transferring the post-initial microcode state from the central electronic core simulation to the post-initial microcode load co-simulator.

3 Claims, 2 Drawing Sheets

POST INITIAL MICROCODE LOAD CO-SIMULATION

CROSS REFERENCE TO RELATED APPLICATIONS

This application is a continuation of U.S. patent application Ser. No. 10/843,607 filed May 11, 2004, the contents of which are incorporated by reference herein in their entirety.

BACKGROUND

The invention relates to the creation of a post-IML (initial microcode load) environment.

During the early "bring-up" of any server, any inherent design instabilities are compounded by time to market pressures, and fabrication difficulties. Integrating all of the components (hardware, microcode, and firmware) earlier, e.g. during "pre-bringup" would allow the "bringup" in the laboratory to progress faster. As used herein "bringup" is the initial testing of code and hardware, for example, prototype hardware and code.

The problem is that it is very difficult to get a Post IML state with all of the chip models and code. Hardware simulation accelerators could be used to execute IML and then pre-verify the functions. But this would take 160 hours minimum to just run IML on a hyper accelerator. As used herein "IML", that is "Initial Microcode Load" is a process used in servers, such as IBM zSeries servers, to initialize the hardware, load the firmware, and enable the server for customer use. Also solutions available are to unit test these code paths, however when unit simulation pieces are brought together for the first time in the laboratory, progress is hampered by relatively simple interface problems. This is due to specification anomalies, miscommunication, etc.

These problems illustrate the need for a Post IML Co-Simulation environment that encompasses all of the central electronic core ("CEC") code and hardware models necessary to run a small server, for example, an IBM zSeries eServer.

SUMMARY

The invention described herein overcomes these problems by starting from a software simulator using hardware description language constructs, such as IBM CECSIM, to generate a post-IML "processor state" complete checkpoint, which is then superimposed on the post-IML co-simulator. This allows simulation of circuit behavior by running a central electronic core simulation in a high level simulator, up to and including initial microload, creation of a post-IML (initial microcode load) state, and transferring the post-initial microcode state from the central electronic core simulation to the post-initial microcode load co-simulator. The resulting post-IML complete hardware co-simulation model is used for running test cases to verify functions, where the functions are characterized with a high degree of hardware and software interactions:

The Post-IML co-simulator allows pre-verification of Post-IML activities that would normally be executed for the first time in a "bring-up" laboratory environment. This extended capability results in further reduction in early hardware development costs.

Because of the relatively slow speed of hardware simulation accelerators, the co-simulators remove the time taken to go through a complete IML.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
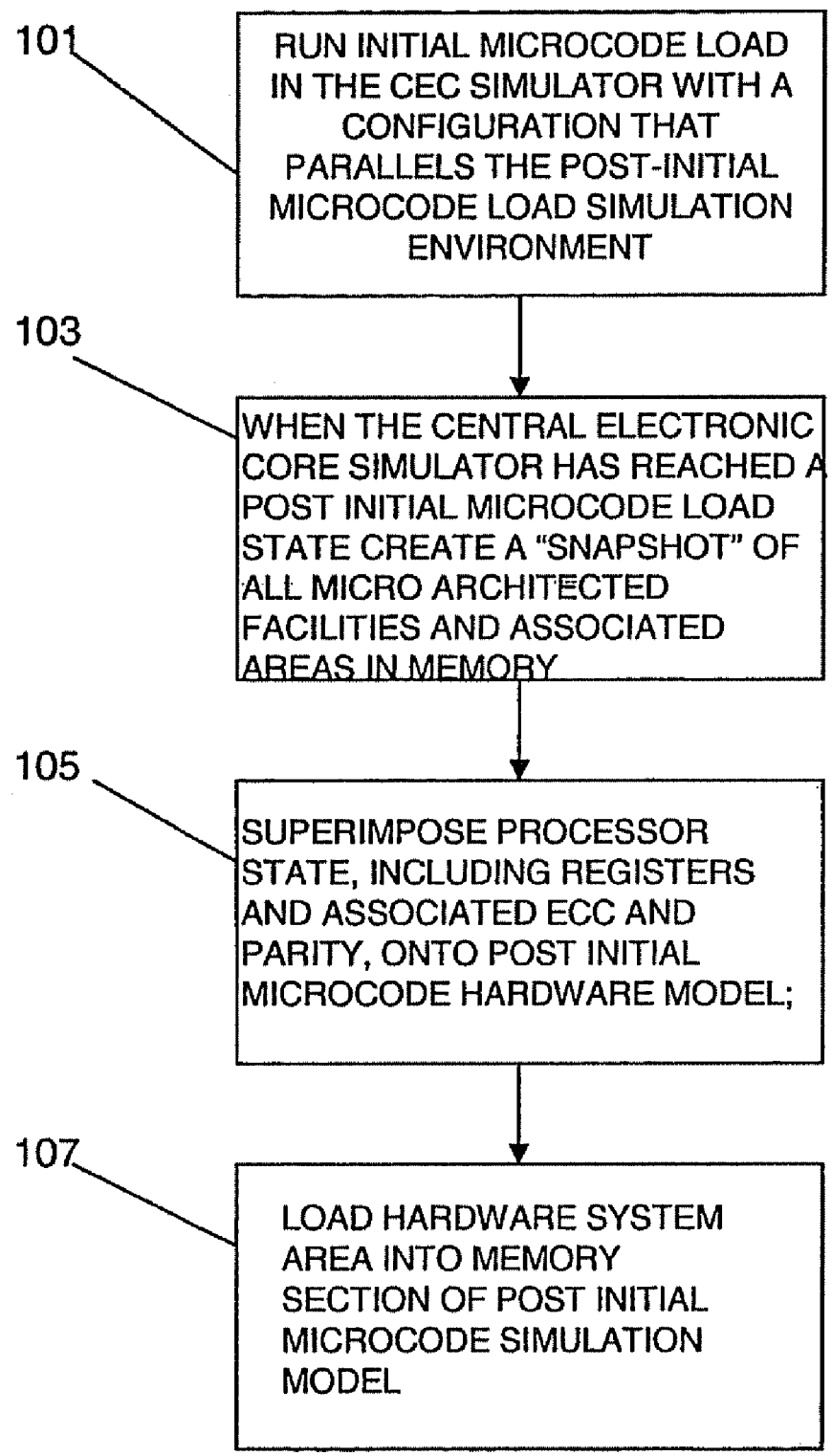
FIG. 1 illustrates a flow chart of an example of the invention.

A method, system, and program product described herein start from a software simulator. The simulator, such as IBM CECSIM, uses hardware description language constructs, to generate a post-IML "processor state" as a complete checkpoint. This post-IML "processor state" is then superimposed on a post-IML co-simulator. The resulting post-IML complete hardware co-simulator model is used for running test cases to verify functions, where the functions are characterized with a high degree of hardware and software interactions:

FIG. 1 illustrates four steps to synchronize the simulator and the post-IML environments:

1) Run the initial microcode load (IML) in a configuration, for example an IBM z/CECSIM configuration, that parallels the post-IML cosimulator environment. This is illustrated in block 101 of FIG. 1.

2) When central electronic core simulator has reached a Post-IML state. At this point create a "snapshot" of all micro-architected facilities and associated data areas in memory. This is illustrated in block 103 of FIG. 1.

3) Superimpose the processor Post-IML state onto the post-IML cosimulation hardware model. This may be done by using simulator API commands, such as SimAPI commands. To update the model state, the registers must be loaded into the model along with associated error correcting code (ecc) and parity. This is illustrated in block 105 of FIG. 1.

4) Load the Hardware System Area ("HSA") into a Memory section of the post-IML cosimulator model. This is illustrated in block 107 of FIG. 1.

Figure 2:
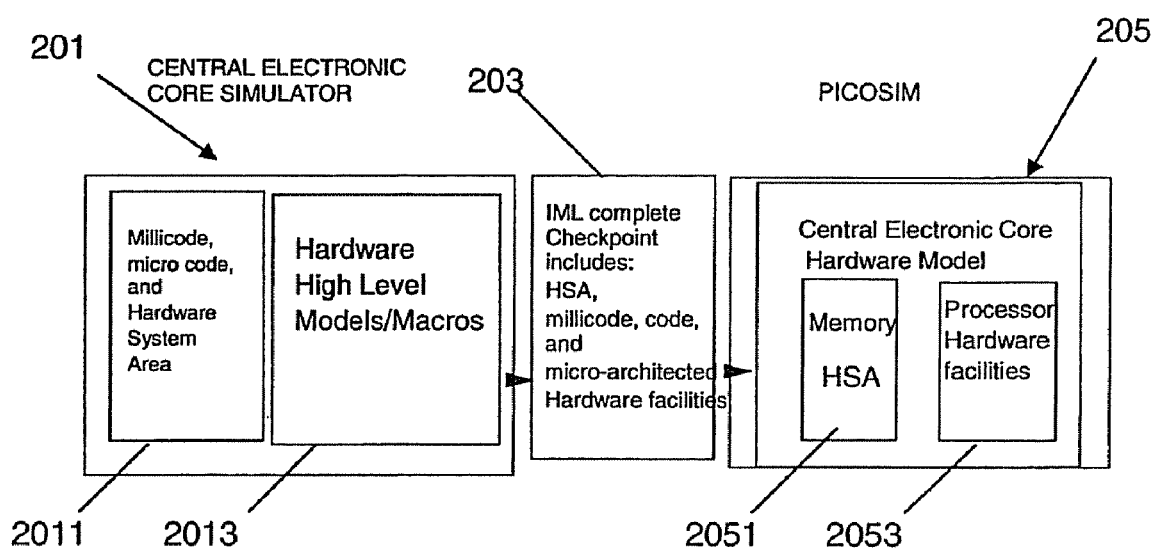
FIG. 2 illustrates the time and data movement processes of the flow chart of FIG. 1.

Upon completion of these steps, as shown in FIG. 2, the post-IML cosimulation environment has been pre-loaded with the post IML characteristics from z/CECSIM. It actually starts where the z/CECSIM PSW (Program Status Word) left off "waiting for work".

As shown in FIG. 2, the data in the central electronic core simulator 201, including millicode, microcode, and hardware system area 2011, and the hardware and high level models and macros 2013, are transferred 203 when the IML is complete, as determined by an IML Checkpoint that includes the Hardware System Area, millicode, code, and micro-architected hardware facilities. The is transferred to the PICOSIM (Post Initial Microcode Load Cosimulator) which includes the Central Electronic Core Hardware Model, with the Memory and Hardware System Area 2051 of the processor being modeled and the processor hardware facilities of the processor being modeled.

For verification purposes, the "work" referred to above is a s/390 testcase that is loaded into customer storage. In an IBM zSeries server, the function Restart PSW (Program Status Word) can be used to "boot" these programs. To execute this function in PICOSIM, it is necessary to insert a New PSW into customer storage at location zero and notify millicode that a Restart PSW is requested. When clocks are applied to the PICOSIM model, millicode retrieves the New PSW, and program execution begins at the new instruction address that points to the testcase.

The invention may be implemented, for example, by having the hardware simulator as a software application (as an operating system element), a dedicated processor, or a dedicated processor with dedicated code. The code executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for hardware simulation.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++".

Additionally, the program code may, for example, be compressed, encrypted, or both, and may include executable files, script files and wizards for installation, as in Zip files and cab files. As used herein the term machine-readable instructions or code residing in or on signal-bearing media include all of the above means of delivery.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of simulating a logic circuit, comprising:
running an initial microcode load in a first configuration in a high level simulator that parallels a post-initial microcode load state in a post-initial microcode co-simulator environment, wherein the initial microcode load initializes a simulated logic circuit and loads firmware to support code execution using the simulated logic circuit;
creating a snapshot of the post-initial microcode load state in the high level simulator of micro-architected facilities, a Hardware System Area (HSA), and associated data areas in memory in response to completing the initial microcode load;
superimposing the post-initial microcode load state onto a post-initial microcode load co-simulation hardware model, and loading registers into the model to update the model state to run on a co-simulator;
loading the HSA data into a memory section of the post-initial microcode load co-simulator model;
inserting a new program status word (PSW) for a test case;
retrieving the new PSW in response to applying a clock to the post-initial microcode load co-simulator model; and
beginning post-initial microcode load co-simulator model execution on the co-simulator at an instruction address that points to the test case.

2. A program product to simulate a logic circuit, the program product stored on a non-transitory computer readable storage medium readable by a processing circuit and storing instructions for execution by the processing circuit for facilitating a method, the method comprising:
receiving a snapshot of a post-initial microcode load state from a high level simulator of micro-architected facilities, a Hardware System Area (HSA), and associated data areas in memory in response to completing an initial microcode load, the initial microcode load run in a first configuration of the high level simulator that parallels a post-initial microcode load state in a post-initial microcode co-simulator environment, wherein the initial microcode load initializes a simulated logic circuit and loads firmware to support code execution using the simulated logic circuit;
superimposing the post-initial microcode load state onto a post-initial microcode load co-simulation hardware model, and loading registers into the model to update the model state to run on a co-simulator;
loading the HSA data into a memory section of the post-initial microcode load co-simulator model;
inserting a new program status word (PSW) for a test case;
retrieving the new PSW in response to applying a clock to the post-initial microcode load co-simulator model;
beginning post-initial microcode load co-simulator model execution on the co-simulator at an instruction address that points to the test case; wherein the superimposing further comprises loading associated error correcting code (ecc) and parity values to update the model state to run on the co-simulator;
wherein the superimposing is performed using simulator API commands; and
asserting a notification that a restart of the co-simulator is requested to begin execution of the post-initial microcode load co-simulator model.

3. A system comprising:
a high-level circuit simulator providing central electronic core simulation, the high-level circuit simulator comprised of millicode, microcode, a hardware system area (HSA), hardware and high level models configured to execute an initial microcode load (IML) in a configuration and create a snapshot of all micro-architected facilities and associated data areas in memory upon reaching a post-IML state as a post-IML checkpoint; and
a co-simulator configured to execute a post-IML co-simulation hardware model superimposed with the post-IML checkpoint including registers, and data from the HSA is loaded into a memory section of the post-IML co-simulator model to establish a post-IML co-simulation environment for executing a test case using the post-IML co-simulation environment, the executing initiated at a modified program status word (PSW) for the test case;

wherein the modified PSW is retrieved in response to applying a clock to the post-initial microcode load co-simulator model;

wherein the post-initial microcode load co-simulator model begins execution on the co-simulator at an instruction address that points to the test case;

wherein a notification is asserted that a restart of the co-simulator is requested to begin execution of the post-initial microcode load co-simulator model;

wherein the post-IML co-simulation hardware model is further superimposed with associated error correcting code (ecc) and parity values to establish the post-IML co-simulation environment for executing the test case;

wherein the post-IML co-simulation hardware model is superimposed using simulator API commands.

\* \* \* \* \*